(12) United States Patent
Lee et al.

(10) Patent No.: US 6,721,211 B2
(45) Date of Patent: Apr. 13, 2004

(54) VOLTAGE GENERATOR FOR SEMICONDUCTOR MEMORY DEVICE

(75) Inventors: Jae Jin Lee, Kyoungki-do (KR); Kang Seol Lee, Seoul (KR)

(73) Assignee: Hynix Semiconductor Inc, Kyoungki-Do (KR)

( * ) Notice: Subject to any disclaimer, the term of this patent is extended or adjusted under 35 U.S.C. 154(b) by 0 days.

(21) Appl. No.: 10/246,083

(22) Filed: Sep. 18, 2002

(65) Prior Publication Data

US 2003/0117857 A1 Jun. 26, 2003

(30) Foreign Application Priority Data

Dec. 21, 2001 (KR) .......................... 2001-82256

(51) Int. Cl.[7] ................................ G11C 7/00
(52) U.S. Cl. ................... 365/189.09; 365/226
(58) Field of Search .................... 365/189.09, 226, 365/230.06

(56) References Cited

U.S. PATENT DOCUMENTS

| | | | |
|---|---|---|---|
| 4,780,854 A | 10/1988 | Watanabe et al. | 365/226 |
| 4,984,202 A | 1/1991 | Kawahara et al. | 365/177 |
| 5,072,134 A | 12/1991 | Min | 327/536 |
| 5,297,097 A | 3/1994 | Etoh et al. | 365/226 |
| 5,508,962 A * | 4/1996 | McLaughlin et al. | 365/189.09 |
| 5,929,539 A | 7/1999 | Kozaru et al. | 307/85 |
| 5,973,981 A * | 10/1999 | Lee | 365/189.09 |
| 6,021,080 A | 2/2000 | Miyano | 365/226 |
| 6,067,269 A | 5/2000 | Han et al. | 365/226 |
| 6,081,459 A * | 6/2000 | Kim | 365/226 |
| 6,104,659 A | 8/2000 | Yagishita et al. | 365/226 |
| 6,449,208 B1 * | 9/2002 | Kono et al. | 365/189.09 |
| 6,584,020 B2 * | 6/2003 | Yamauchi et al. | 365/189.09 |

FOREIGN PATENT DOCUMENTS

| | | |
|---|---|---|
| JP | 2-183495 | 7/1990 |
| JP | 5-334873 | 12/1993 |
| JP | 8-115599 | 5/1996 |
| JP | 9-259584 | 10/1997 |
| JP | 10-055667 | 2/1998 |
| JP | 10-144079 | 5/1998 |
| JP | 11-176181 | 7/1999 |
| JP | 11-250669 | 9/1999 |
| JP | 11-273355 | 10/1999 |
| JP | 2000-208637 | 7/2000 |
| JP | 2000-268578 | 9/2000 |

* cited by examiner

*Primary Examiner*—Trong Phan
(74) *Attorney, Agent, or Firm*—Marshall, Gerstein & Borun LLP

(57) ABSTRACT

A voltage generator for a semiconductor memory device that improves the drivability of an output driver by controlling a gate of the output driver to vary between an internal power supply voltage and a ground voltage, is disclosed. The voltage generator includes an output voltage controller to generate a pull-up signal for controlling a pull-up operation and a pull-down signal for controlling a pull-down operation, the pull-up signal having a level substantially equivalent to an internal power supply voltage if a cell plate voltage is higher than a cell plate reference voltage, and having a level below the cell plate voltage if the cell plate voltage is lower than the cell plate reference voltage. The voltage generator further includes an output driver to generate a stable cell plate voltage in response to the pull-up signal and the pull-down signal.

18 Claims, 14 Drawing Sheets

VOLTAGE GENERATOR FOR SEMICONDUCTOR MEMORY DEVICE

TECHNICAL FIELD

Semiconductor memory devices are disclosed, and more particularly, a voltage generator for generating a stable cell plate voltage with improved drivability of an output driver in a semiconductor memory device is disclosed.

DESCRIPTION OF THE PRIOR ART

In general, a bit line precharge voltage Vblp for precharging a bit line in a DRAM device has a voltage level somewhere between a high voltage data signal and a low voltage data signal, which is stored in a DRAM cell. The bit line precharge voltage Vblp is ½ of the value of the voltage stored in the DRAM cell, thereby minimizing the power consumption in an equalization operation.

The cell plate voltage Vcp is a voltage applied to a reference terminal of a DRAM cell capacitor and is equivalent to ½ of the value, (½*Vcc), of the bit line precharge voltage Vblp. The cell plate voltage Vcp is used to ensure the reliability of the DRAM cell capacitor by supplying ½*Vcc between both terminals of the DRAM cell capacitor regardless of the data voltage stored in the DRAM cell.

FIG. 1 is an exemplary circuit diagram of a prior art cell plate voltage generator. The circuit of FIG. 1 is applicable to a bit line precharge voltage generator. Referring to FIG. 1, the cell plate voltage generator includes a voltage divider 10, a bias voltage generator 20, a gate voltage generator 30, an output voltage controller 40 and an output driver 50.

The voltage divider 10 includes resistors R1 and R2 connected in series to an internal power supply voltage Vcc and a ground voltage Vss, and in cases where an internal power supply voltage Vcc is externally supplied, divides the internal power supply voltage Vcc to generate a cell plate reference voltage Vcp_ref.

The bias voltage generator 20 includes a PMOS transistor P1 wherein the cell plate reference voltage Vcp_ref is supplied to its gate, and a PMOS transistor P2 and NMOS transistors N1 and N2, configured in a current-mirror manner. The bias voltage generator 20 generates an n-bias voltage Nbias to enable a constant current flow to the ground voltage Vss, and a p-bias voltage Pbias to enable a constant current flow from an internal power supply voltage Vcc.

The gate voltage generator 30 includes PMOS transistors P3 and P4, and NMOS transistors N3 and N4, configured in a current-mirror manner. The gate voltage generator 30 generates an n-gate voltage Ngate that is higher, by a threshold voltage Vt of the NMOS transistor N3, than the cell plate reference voltage Vcp_ref. The gate voltage generator 30 also generates a p-gate voltage Pgate that is lower, by a threshold voltage Vt of the PMOS transistor P4, than the cell plate reference voltage Vcp_ref.

The output voltage controller 40 includes PMOS transistors P5 and P6, and NMOS transistors N5 and N6, connected in series between the internal power supply voltage Vcc and the ground voltage Vss. The p-bias voltage Pbias is applied to a gate of the PMOS transistors P5. The p-gate voltage Pgate is applied to a gate of PMOS transistor P6. The n-gate voltage Ngate is applied to an NMOS transistor N5. The n-bias voltage Nbias is applied to a gate of NMOS transistor N6. The output voltage controller 40 generates a pull-up signal PU and a pull-down signal PD.

The output driver 50 includes a PMOS transistor P7, and an NMOS transistor N7, that are connected between the internal power supply voltage Vcc and the ground voltage Vss. The output driver 50 generates a cell plate voltage Vcp. The pull-up signal PU is provided to a gate of the PMOS transistor P7 while the pull-down signal PD is provided to a gate of the NMOS transistor N7.

The NMOS transistors N1, N2, N4 and N6 receive the n-bias voltage Nbias and flow a constant current with a slight variation to the ground voltage Vss. The PMOS transistors P2, P3 and P5 receive the p-bias voltage Pbias and flow a constant current with a slight variation to the internal power supply voltage Vcc. The n-gate bias Ngate is selected in order to ensure a constant current flow to the PMOS transistor P3 and the NMOS transistor N3 of the n-gate voltage generator 30 in an equilibrium state.

If the cell plate voltage Vcp is higher than the cell plate reference voltage Vcp_ref, the current flowing to the NMOS transistor N5 is decreased and the voltage of the pull-up signal PU is increased, thereby causing the PMOS transistor P7 to turn off. If, however, the cell plate voltage Vcp is lower than the cell plate reference voltage Vcp_ref, the current flowing to the NMOS transistor N5 is increased and the voltage of the pull-up signal PU is decreased, thereby causing the PMOS transistor P7 to turn on.

Referring to the cell plate voltage generator illustrated in FIG. 1, if the cell plate voltage Vcp is set to a value substantially near ½*Vcc, the voltage of the pull-up signal PU swings between the internal power supply voltage Vcc and ½*Vcc while the voltage of the pull-down signal PD swings between ½*Vcc and the ground voltage Vss.

At this time, if the internal power supply voltage Vcc is lowered, the cell plate voltage Vcp is lower than the threshold voltage Vt. Then, the PMOS transistor P7 is not sufficiently turned on. Similarly, the phenomenon may occur in the NMOS transistor P7. Because the threshold voltage of the PMOS transistor is higher relative to that of the NMOS transistor, and the current drivability of the PMOS transistor is lower than that of the NMOS transistor in the same size and the problem generally occurs in the pull-up device in advance.

FIG. 2 is a graph illustrating the resultant value of the voltages of FIG. 1. FIG. 3 shows the current waveform of the cell plate voltage Vcp in FIG. 1, which is a simulation graph of the current drivability of the cell plate voltage Vcp in 0.13 $\mu$m technology where the temperature is 0° and the power voltage is 1.5V.

In general, it is estimated that the cell plate voltage Vcp is maintained at ½*1.5V, and that at 0.75V, no voltage variation in the output stage exists in a standby state. However, in the case where the current consumption of the cell plate voltage Vcp is in the range of ±4 mA, the cell plate voltage Vcp drops to 0.3V as shown in FIG. 3. As a result, when the voltage of the pull-up signal PU swings between the internal power supply voltage Vcc and ½*Vcc and the voltage of the pull-down signal PD swings between ½*Vcc and the ground voltage, and if the power supply voltage is lowered, then the cell plate voltage Vcp is also lowered. However, because the threshold voltage Vt of the transistor is not lowered in proportion to the cell plate voltage Vcp, and if the cell plate voltage Vcp is lower than the threshold voltage Vt of the transistor, then the output driver of the cell plate voltage generator is not sufficiently driven.

SUMMARY OF THE DISCLOSURE

A voltage generator is disclosed which improves the drivability of an output driver and to ensure a stable cell plate voltage by controlling a gate signal of the output driver in a cell plate voltage generator to swing between a power supply voltage and a ground voltage.

Thus, an improved voltage generator for a semiconductor memory device is provided. The disclosed voltage generator includes an output voltage controller to generate a pull-up signal and a pull-down signal for controlling a pull-down operation, the pull-up signal having a level substantially equivalent to a power supply voltage if a cell plate voltage is higher than a cell plate reference voltage, the pull-up signal having a level below the cell plate voltage if the cell plate voltage is lower than the cell plate reference voltage. The voltage generator also includes an output driver to generate a stable cell plate voltage in response to the pull-up signal and the pull-down signal.

In an embodiment, the voltage generator may include an output voltage controller to generate a pull-up control signal and a pull-down control signal, the pull-up control signal having a level substantially equivalent to a power supply voltage if a cell plate voltage is higher than a cell plate reference voltage, and a level below the cell plate voltage if the cell plate voltage is lower than the cell plate reference voltage, and the pull-down control signal having a level above the cell plate voltage if the cell plate voltage is higher than the cell plate reference voltage and a level substantially equivalent to a ground voltage if the cell plate voltage is lower than the cell plate reference voltage. The voltage generator also includes an output driver to generate a stable cell plate voltage in response to the pull-up control signal and the pull-down control signal.

DETAILED DESCRIPTION OF THE PRESENTLY PREFERRED EMBODIMENTS

Figure 1:
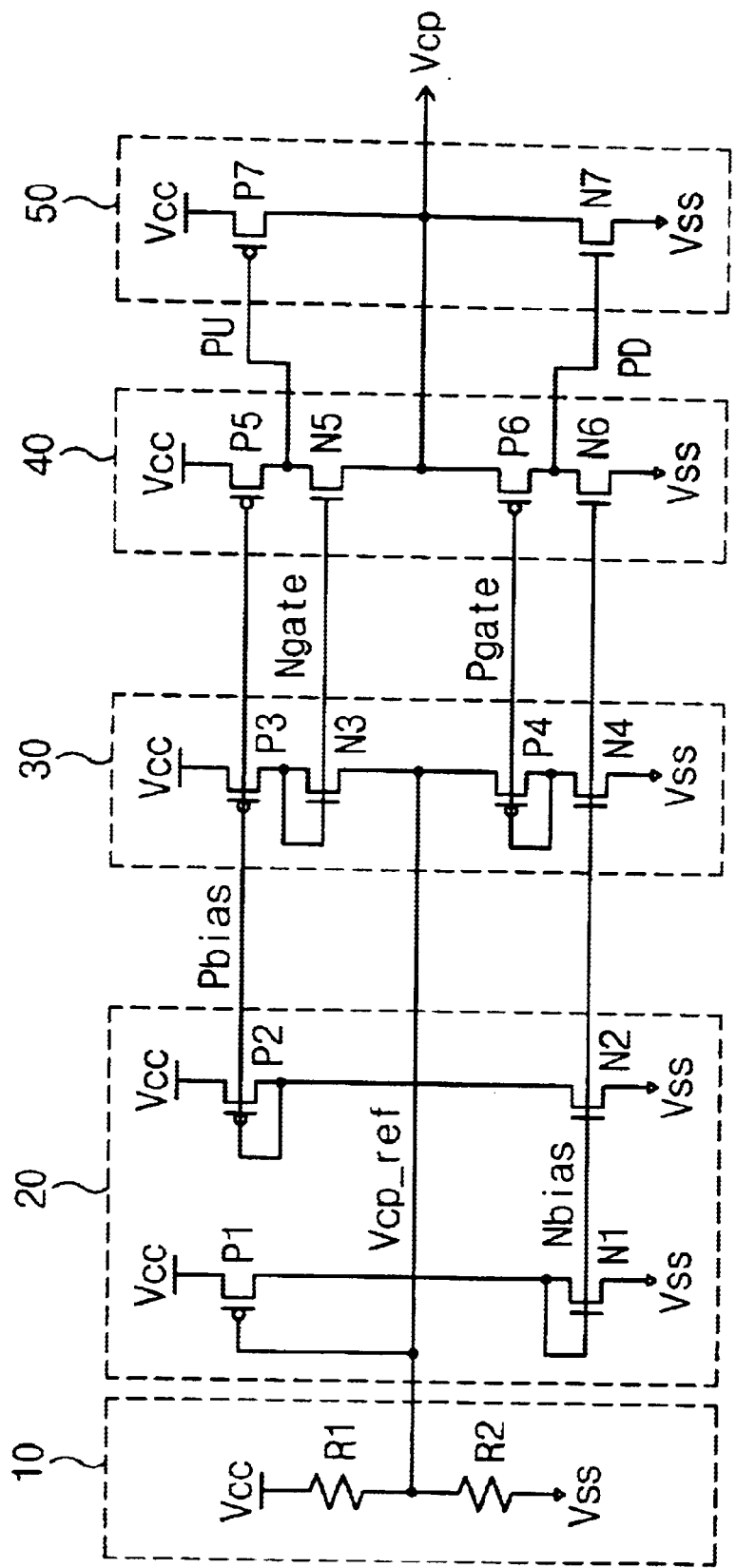
FIG. 1 is a circuit diagram illustrating a prior art cell plate voltage generator.
Figure 2:
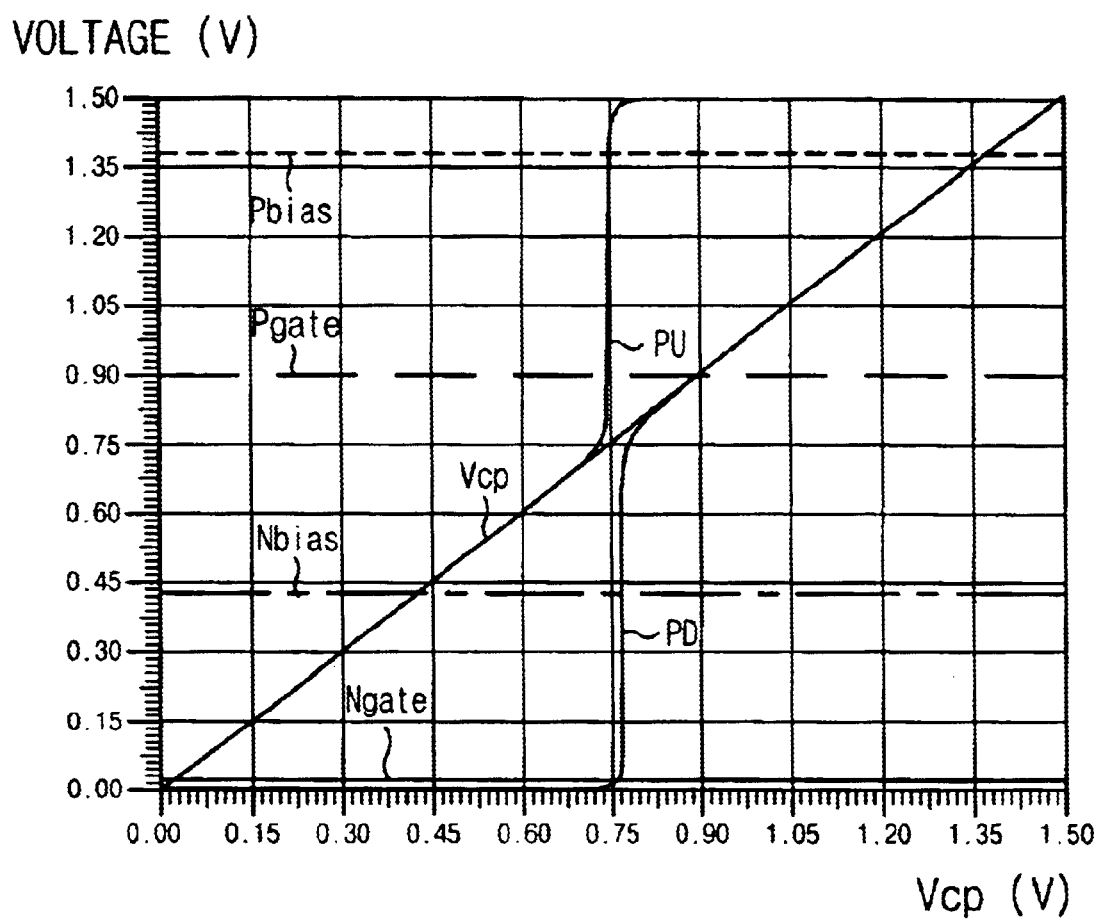
FIG. 2 is a graph illustrating voltages (Vcp) in FIG. 1.
Figure 3:
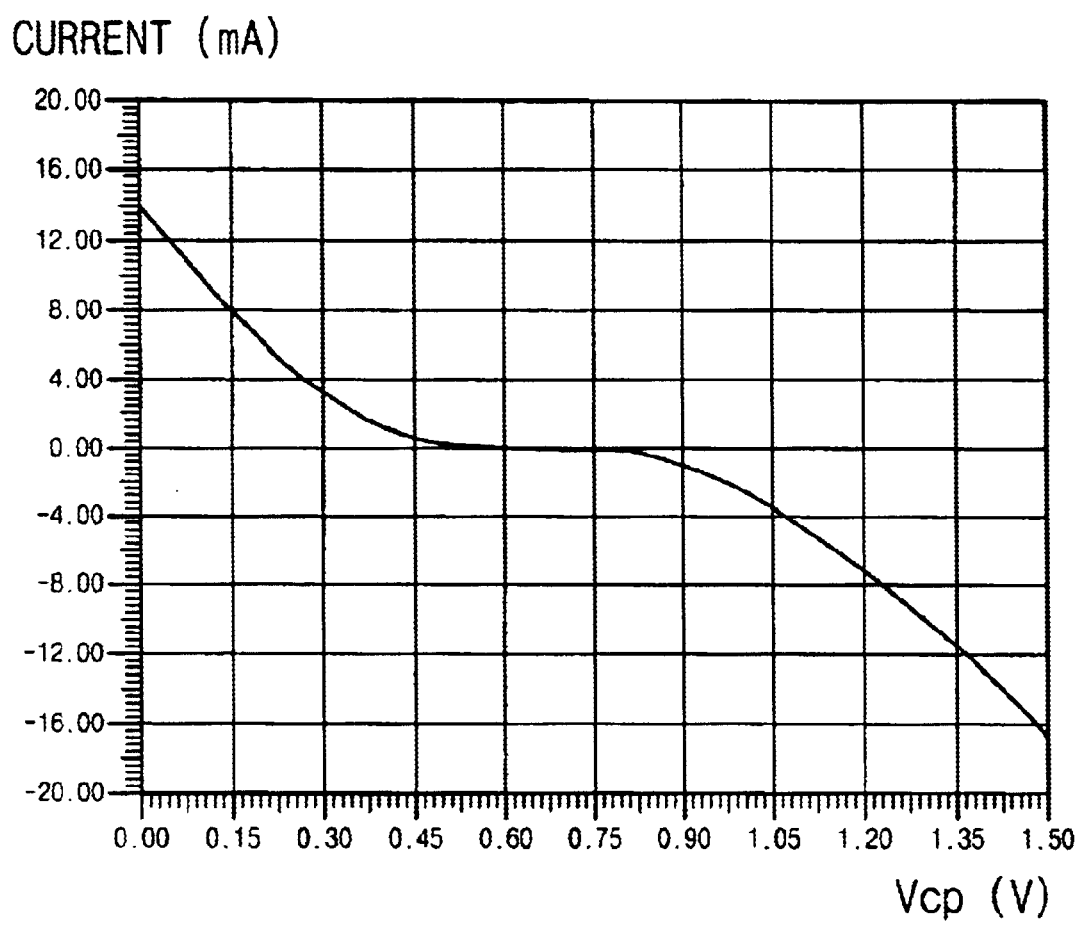
FIG. 3 is a graph illustrating a current (CURRENT v. Vcp) waveform of a cell plate voltage in FIG. 1.
Figure 4:
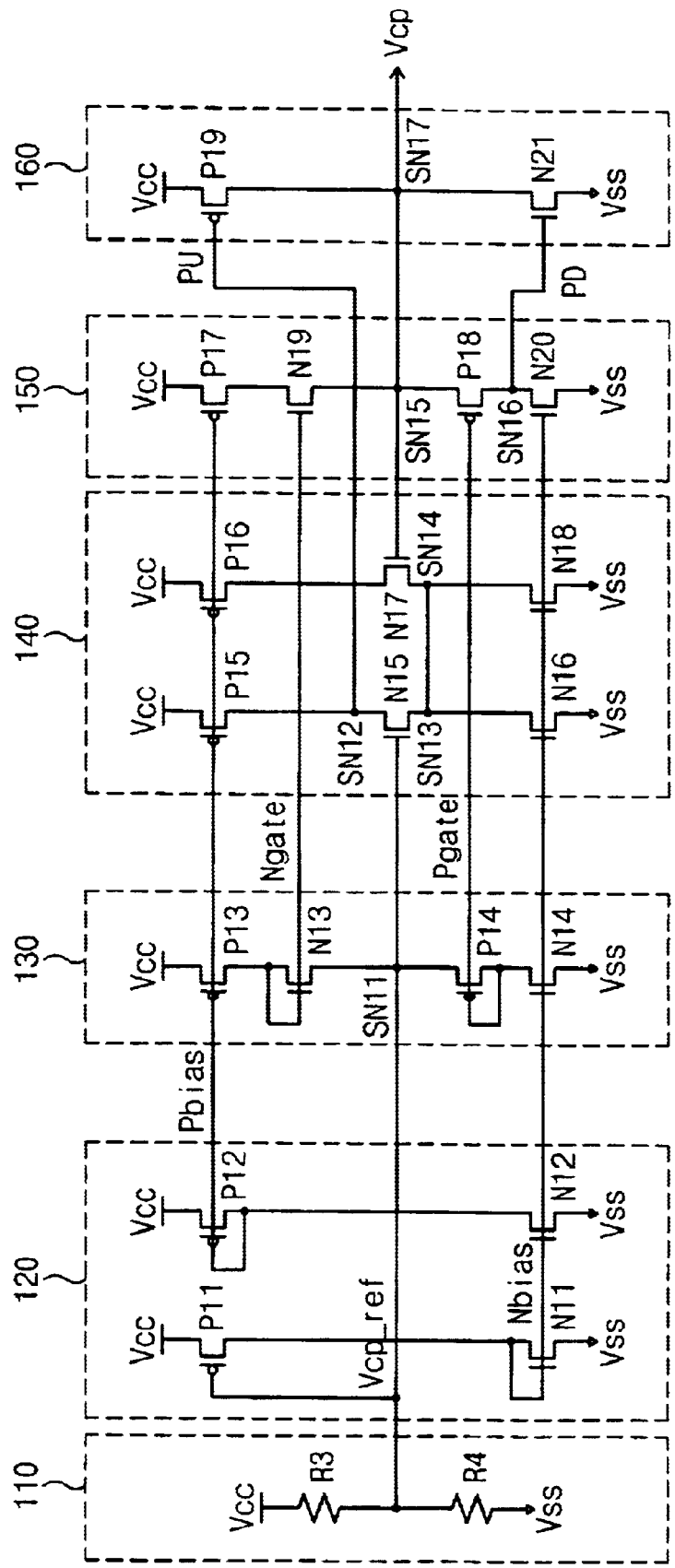
FIG. 4 is a circuit diagram of a disclosed cell plate voltage generator.

FIG. 4 is a circuit diagram of a cell plate voltage generator. The cell plate voltage generator includes a voltage divider 110, a bias voltage generator 120, a gate voltage generator 130, a pull-up controller 140, a pull-down controller 150 and an output driver 160.

The voltage divider 110 includes resistors R3 and R4 connected in series between an internal power supply voltage Vcc and a ground voltage Vss, and generates a cell plate reference voltage Vcp_ref. If the internal power supply voltage Vcc is externally provided, the voltage divider 110 divides the interanl power supply voltage Vcc to generate the cell plate reference voltage Vcp_ref. If the internal power supply voltage Vcc is internally generated, the cell plate reference voltage Vcp_ref may be generated through another reference voltage generator (not shown).

The bias voltage generator 120 includes a PMOS transistor P11 and an NMOS transistor N11 connected in series between the power supply voltage and the ground voltage Vss. The cell plate reference voltage Vcp_ref is applied to a gate of the PMOS transistor P11. The internal power supply voltage Vcc is applied to a source of the PMOS transistor P11. The NMOS transistor N11 has its gate connected to its drain and the ground voltage Vss is applied to its source. A drain of the PMOS transistor P11 is connected to a drain of the PMOS transistor P11.

The bias voltage generator 120 further includes a PMOS transistor P12 and an NMOS transistor N12 connected in series between the internal power supply voltage Vcc and the ground voltage Vss. The PMOS transistor P12 has its gate connected to its drain, and the internal power supply voltage Vcc is applied to its source. The NMOS transistor N12 is connected to the NMOS transistor N11 in a current-mirror manner, and an n-bias voltage Nbias is applied to its gate. A drain of the NMOS transistor N12 is connected to the drain of the PMOS transistor P12, and the ground voltage Vss is applied to its source.

The bias voltage generator 120 generates the n-bias voltage Nbias for flowing a constant current to the ground voltage Vss and generates the p-bias voltage Pbias for flowing a constant current from the internal power supply voltage Vcc.

The gate voltage generator 130 includes a PMOS transistor P13, an NMOS transistor N13, a PMOS transistor P14, and an NMOS transistor 14 sequentially connected, in series, between the internal power supply voltage Vcc and the ground voltage Vss. The PMOS transistor P13 is connected to the PMOS transistor P12 in a current-mirror manner. The p-bias voltage Pbias is applied to a gate of the PMOS transistor P13. The internal power supply voltage Vcc is applied to a source of the PMOS transistor P13. A gate and a source of the NMOS transistor N13 are connected to each other. A drain and the source of the NMOS transistor N13 are connected to a drain of the PMOS transistor P13 and a node SN11, respectively. A gate and a drain of the PMOS transistor P14 are connected to each other. A source of the PMOS transistor P14 is connected to the node SN11. The NMOS transistor N14 is connected to the NMOS transistors N11 and N12 in a current-mirror manner. The n-bias voltage Nbias is applied to a gate of the NMOS transistor N14. The ground voltage Vss is applied to a source of the NMOS transistor N14. A drain of NMOS transistor N14 is connected to the drain of the PMOS transistor P14.

The gate voltage generator 130 generates an n-gate voltage Ngate that is higher by the threshold voltage Vt of the NMOS transistor N13 than the cell plate reference voltage Vcp_ref and also generates a p-gate voltage Pgate that is lower than the cell plate reference voltage Vcp_ref by the threshold voltage Vt of the PMOS transistor N14. The pull-up controller 140 includes a PMOS transistor P15 and NMOS transistors N15 and N16 connected, in series, between the internal power supply voltage Vcc and the ground voltage Vss. The PMOS transistor P15 is connected to the PMOS transistors P12 and P13 in a current-mirror manner. The p-bias voltage Pbias is applied to a gate of the PMOS transistor P15. The internal power supply voltage Vcc is applied to a source of PMOS transistor P115. A drain of the PMOS transistor P15 is connected to a node SN12. The cell plate reference voltage Vcp_ref is applied to a gate of the NMOS transistor N15. A drain of the NMOS transistor N15 is connected to a node SN12, and has its source connected to a node SN13. The NMOS transistor N16 is connected to the NMOS transistors N11, N12 and N14 in a current-mirror manner. The n-bias voltage Nbias is applied to a gate of the NMOS transistor N16. The NMOS transistor N16 has its drain connected to the node SN13 and the ground voltage Vss is applied to its source.

The pull-up controller 140 further includes a PMOS transistor P16 and NMOS transistors N17 and N18 connected, in series, between the internal power supply voltage Vcc and the ground voltage Vss. The PMOS transistor P16 is connected to the PMOS transistors P12, P13 and P15 in a current-mirror manner. The p-bias voltage Pbias is applied to a gate of the PMOS transistor P116. The internal power supply voltage Vcc is applied to a source of the PMOS transistor P16. A voltage of a node SN15 is applied to a gate of the NMOS transistor N17. The NMOS transistor N17 has its drain connected to a drain of the PMOS transistor P16 and its source connected to a node SN14. The NMOS transistor N18 is connected to the NMOS transistors N11, N12, N14 and N16 in a current-mirror manner. The n-bias voltage Nbias is applied to a gate of the NMOS transistor N18. The NMOS transistor N18 has its drain connected to the node SN14 and the ground voltage Vss is applied to its source. The sources of the NMOS transistors N15 and N17 are connected to each other.

The pull-up controller 140 outputs a pull-up signal PU having a level of the internal power supply voltage Vcc, when the cell plate voltage Vcp is higher than the cell plate reference voltage Vcp_ref and outputs a pull-up signal PU having a level below the cell plate voltage Vcp that is, a level of near the ground voltage Vss, when the cell plate voltage Vcp is lower than the cell plate reference voltage Vcp_ref.

As described above, the pull-up signal PU is controlled to vary between the internal power supply voltage Vcc and the ground voltage Vss so that the drivability of the output driver 160 in the cell plate voltage generator can be largely improved.

The pull-down controller 150 includes a PMOS transistor P17 and an NMOS transistor N19 connected, in series, between the internal power supply voltage Vcc and the node SN15. The PMOS transistor P17 is connected to the PMOS transistors P12, P13, P15 and P16 in a current-mirror manner. The p-bias voltage Pbias is applied to a gate of the PMOS transistor P17. The internal power supply voltage Vcc is applied to a source of the PMOS transistor P17. The NMOS transistor N19 is connected to the NMOS transistor N13 in a current-mirror manner. The n-gate voltage Ngate is applied to a gate of the NMOS transistor N19. The NMOS transistor N19 has its drain connected to a drain of the PMOS transistor P17 and its source connected to the node SN15.

The pull-down controller 150 further includes a PMOS transistor P18 and an NMOS transistor N20 connected in series between the node SN15 and the ground voltage Vss. The PMOS transistor P18 is connected to the PMOS transistor P14 in a current-mirror manner. The p-gate voltage Pgate is applied to a gate of the PMOS transistor P18. The PMOS transistor P18 has its source connected to the node SN15, and its drain connected to an output node SN16 of the pull-down controller 150. The NMOS transistor N20 is connected to the NMOS transistors N11, N12, N14, N16 and N18 in a current-mirror manner. The n-bias voltage Nbias is applied to a gate of the NMOS transistor N20. The NMOS transistor N20 has its drain connected to the node 16 and the ground voltage Vss is applied to its source.

The pull-down controller 150 generates a pull-down signal PD for controlling the pull-down operation of the output driver 160.

The output driver 160 includes a PMOS transistor P19 and an NMOS transistor N21 connected in series between the internal power supply voltage Vcc and the ground voltage Vss. The pull-up signal PU is applied to a gate of the NMOS transistor N20. The internal power supply voltage Vcc is applied to a source of the NMOS transistor N20. The NMOS transistor N20 has its drain connected to an output node SN17. The pull-down signal PD is applied to a gate of the NMOS transistor N20. The NMOS transistor N20 has its drain connected to an output node and the ground voltage Vss is applied to its source.

The output driver 160 receives the pull-up signal PU and the pull-down signal PD at the gates of the PMOS transistor P19 and the NMOS transistor N21, respectively, and generates the stable cell plate voltage Vcp.

Operation of the cell plate voltage generator shown in FIG. 4 will now be described.

First, the node SN13 and the node 14 are shorted together. Thus, the voltage of the node 13 is equal to the voltage of the node 14.

The current which flows through the NMOS transistors N15 and N17 has an approximate relation Ids=gm(Vgs−Vt) between the voltages of the gates and voltages of the nodes SN13 and SN14. Herein, Ids designates the current that flows through the NMOS transistor, gm a proportional constant, Vgs a voltage difference between the gate and the source, Vt a threshold voltage of the transistor, respectively. In this configuration, Vgs is the voltage difference between the cell plate reference voltage Vcp_ref and the node SN13 in the NMOS transistor N15 and Vgs is the voltage difference between the cell plate voltage Vcp and the node SN14, depending on which transistor is being modeled.

According to above relations Ids=gm(Vgs−Vt), if the cell plate voltage Vcp is larger than the cell plate reference voltage Vcp_ref, the voltage of the node SN14 is higher than the voltage of the node SN13. Then, the NMOS transistor N15 turns off and the pull-up signal PU becomes the level of the internal power supply voltage Vcc and the PMOS transistor P19 turns off.

When the cell plate voltage Vcp is lower than the cell plate reference voltage Vcp_ref, the voltage of the node SN14 is lower than the voltage of the node SN13. In this case, the current flowing through the NMOS transistor N15 is higher than the current flowing through the NMOS transistor N15 when the cell plate voltage Vcp is equal to the cell plate reference voltage Vcp_ref. The voltage is maintained at a level below the cell plate voltage. In this configuration, the pull-up signal PU maintains the level below the cell plate voltage Vcp, that is, the level of near Vss, and the PMOS transistor P19 turns on.

As compared when the prior art, pull-up signal PU turns on the PMOS transistor P19 with the cell plate voltage Vcp the pull-up signal PU of the disclosed device sufficiently turns on the PMOS transistor P19 with the voltage having a level of below the cell plate voltage Vcp. Therefore, enhanced drivability is obtained.

Figure 5:
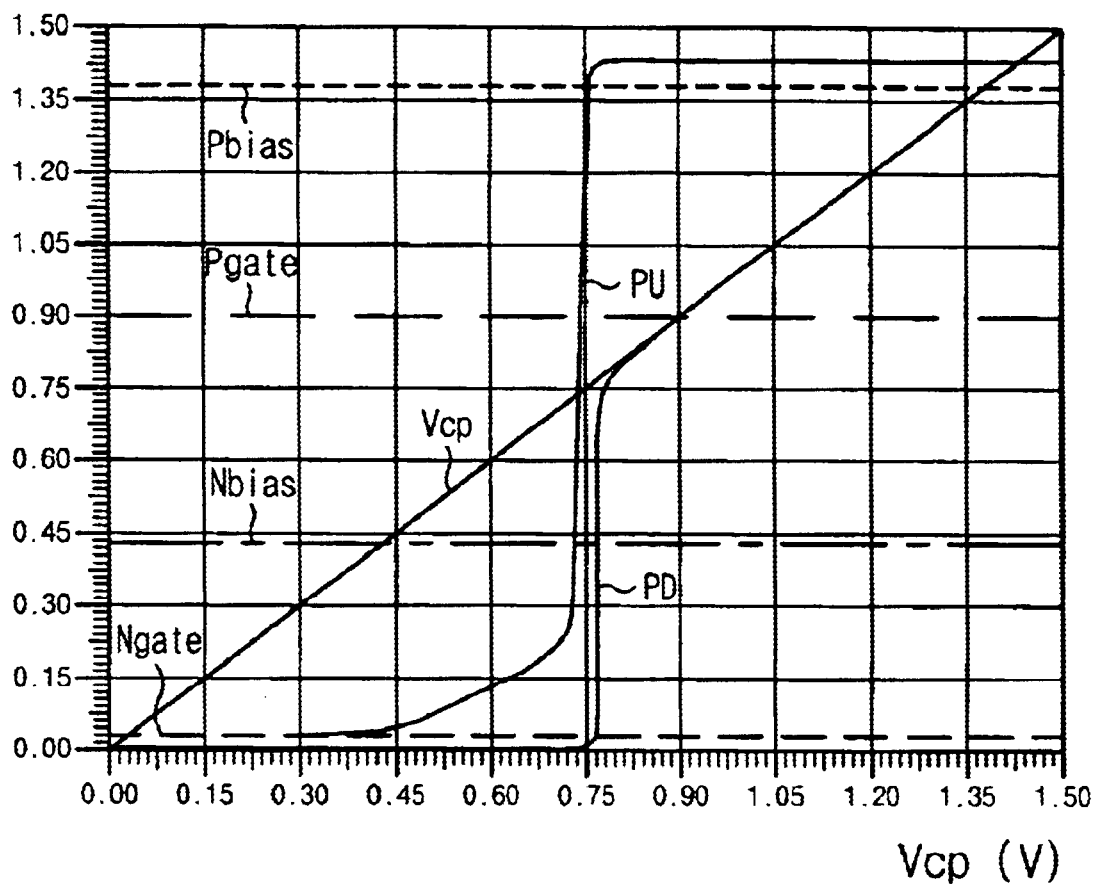
FIG. 5 is a graph illustrating voltages (VOLTAGE v. Vcp) of the embodiment shown in FIG. 4.
Figure 6:
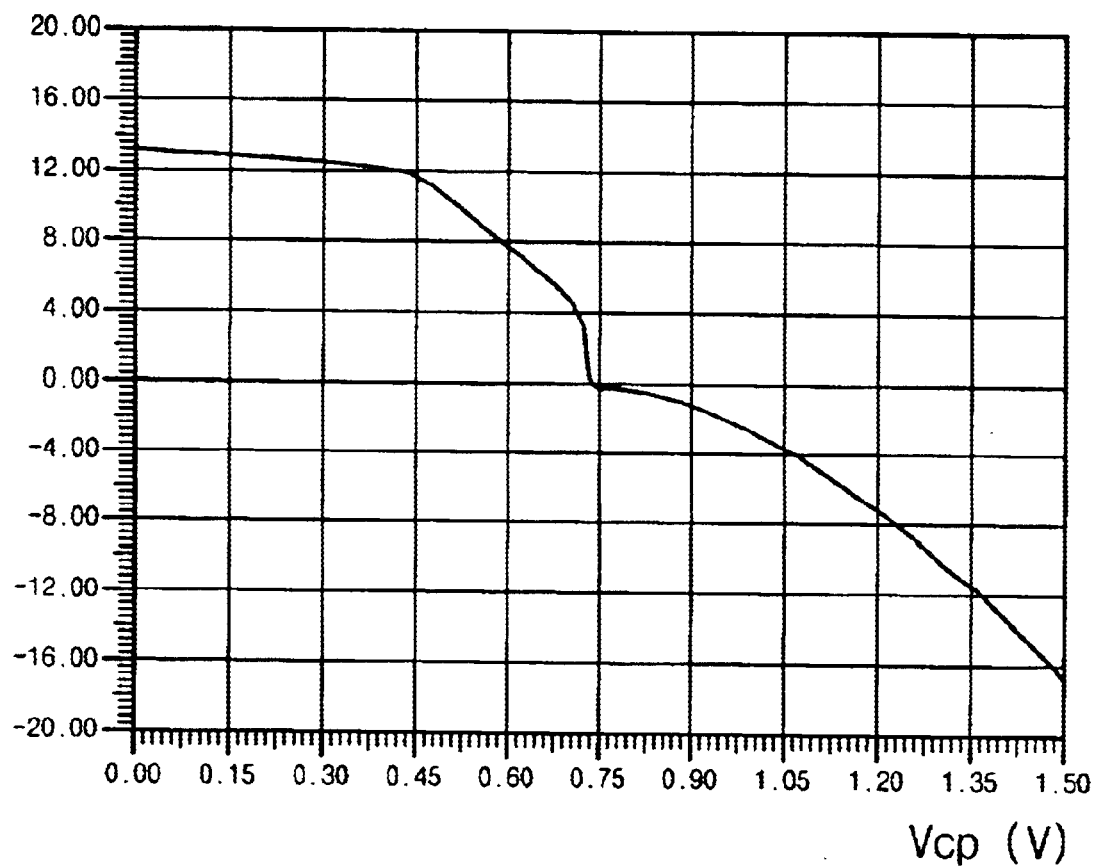
FIG. 6 is a graph illustrating a current (CURRENT v. Vcp) waveform of a cell plate voltage in FIG. 4.

FIG. 5 is a graph illustrating exemplary waveforms of resultant values of the voltages in FIG. 4. FIG. 6 is a graph illustrating an exemplary current waveform of the cell plate voltage Vcp in FIG. 4. Referring to FIG. 6, in a case where the cell plate voltage consumes about 4 mA of current, the cell plate voltage Vcp does not drop below 0.7V.

Figure 7:
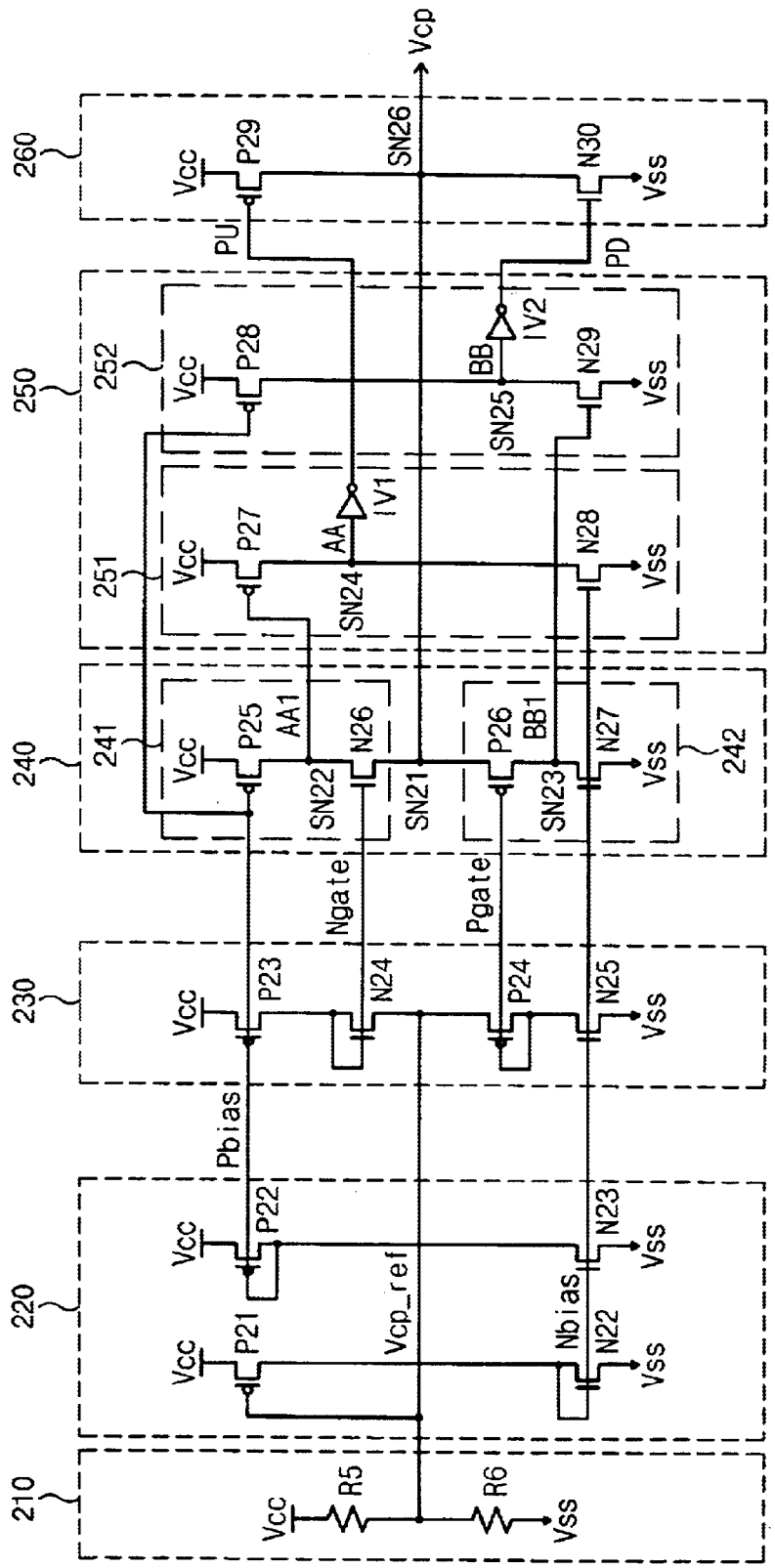
FIG. 7 is a circuit diagram of another disclosed cell plate voltage generator.
Figure 8A:
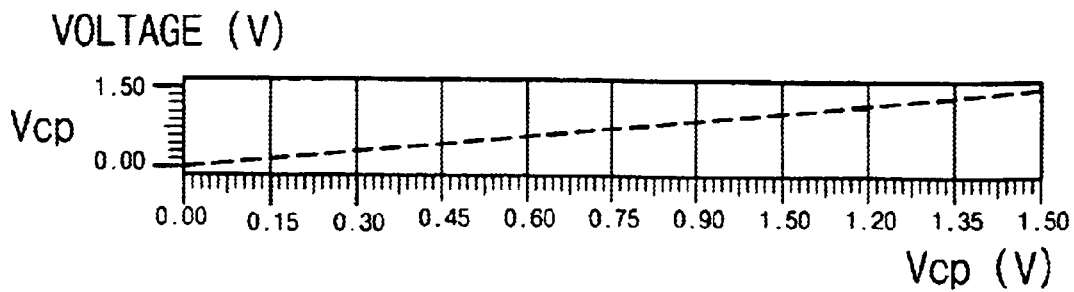
FIGS. 8A through 8G are graphs illustrating voltages (Vcp, PU, PD, AA1, AA, BB1, AND BB respectively in FIGS. 8A–8G) of the embodiment shown in FIG. 7.
Figure 8B:
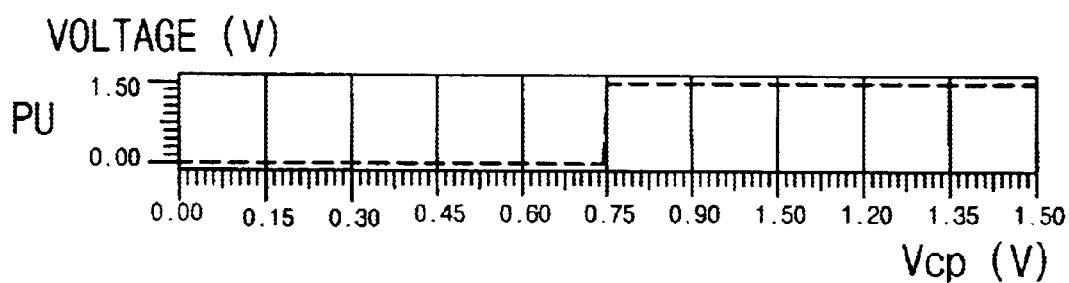
Figure 8C:
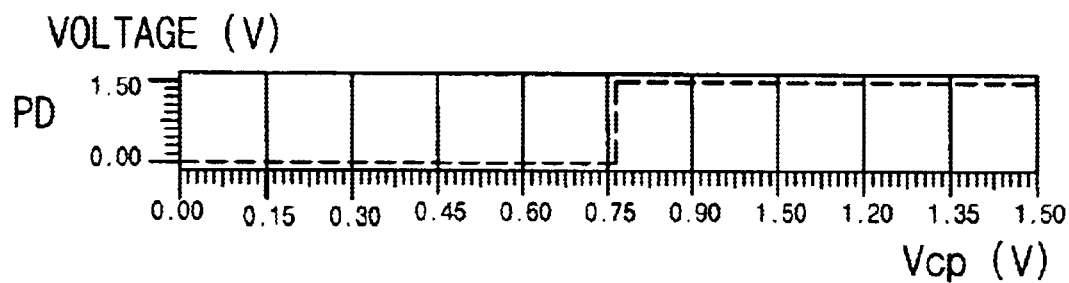
Figure 8D:
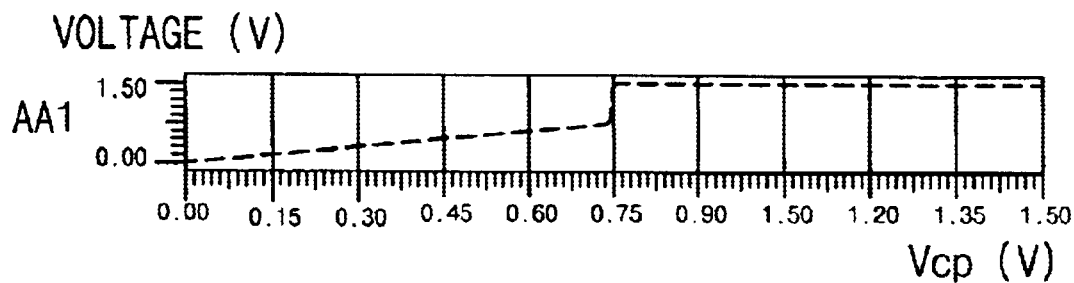
Figure 8E:
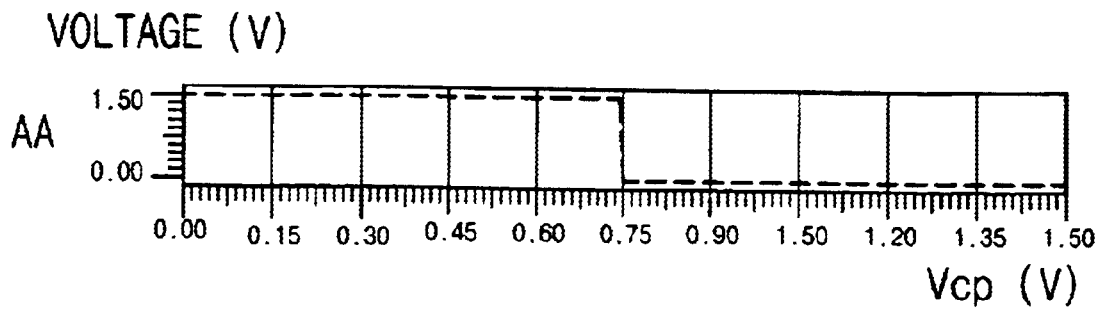
Figure 8F:
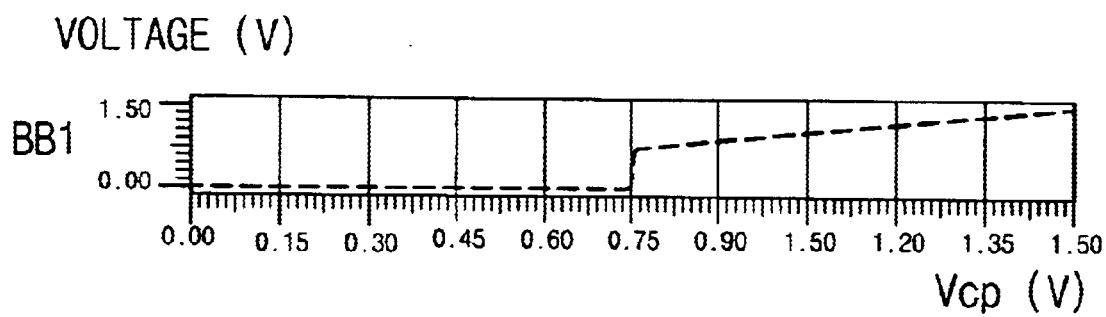
Figure 8G:
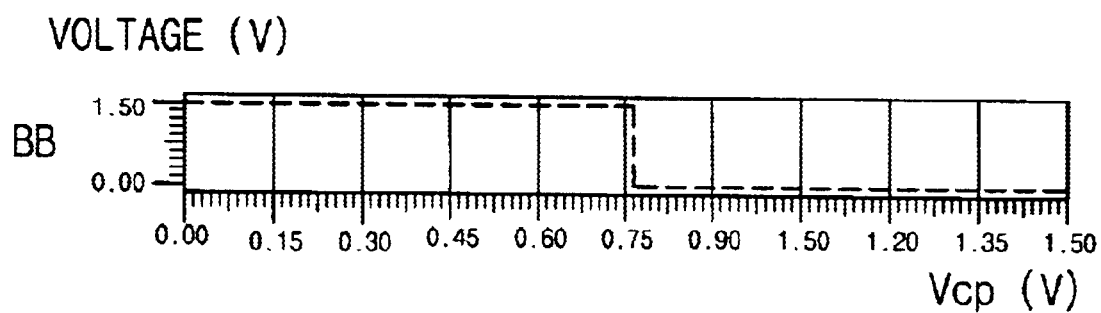

FIG. 7 is a circuit diagram of another cell plate voltage generator constructed in accordance with the teachings of the invention. The generator includes a voltage divider 210, a bias voltage generator 220, a gate voltage generator 230, a first output voltage controller 240, a second output voltage controller 250 and an output driver 260.

The construction and operation of the voltage divider 210, the bias voltage generator 220, and the gate voltage generator 230 is substantially identical to the construction and operation of the voltage divider 110, the bias voltage generator 120 and the gate voltage generator 130 of the cell plate voltage generator described in connection with FIG. 4. Accordingly, the detailed description of the voltage divider 210, the bias voltage generator 220, and the gate voltage generator 230, will be omitted.

Referring to FIG. 7, the first output voltage generator 240 includes a controller 241 which receives an internal power supply voltage Vcc, a p-bias voltage Pbias and an n-gate voltage Ngate to generate a pull-up control signal AA1 and a controller 242 which receives a ground voltage Vss, an n-bias voltage Nbias and a p-gate voltage Pgate to generate a pull-down control signal BB1.

In the controller 241, a PMOS transistor P25 is connected to PMOS transistors P22 and P23 in a current-mirror manner. The p-bias voltage Pbias is applied to a gate of the PMOS transistor P25 and the internal power supply voltage Vcc is applied to its source. The PMOS transistor P25 has its drain connected to a node SN22. An NMOS transistor N26 is connected to an NMOS transistor N24 in a current-mirror manner. The n-gate voltage Ngate is applied to a gate of the NMOS transistor N26. The NMOS transistor N26 has its drain connected to the node SN22 and its source connected to a node SN21.

The controller 242 includes a PMOS transistor P26 connected to PMOS transistor P24 in a current-mirror manner. The p-gate voltage Pgate is applied to a gate of the PMOS transistor P26. The PMOS transistor P26 has its source connected to the node SN21 and its drain connected to an output node SN23. An NMOS transistor N27 is connected to an NMOS transistor N22, N23 and N25 in a current-mirror manner. The n-bias voltage Nbias is applied to a gate of the NMOS transistor N27. The NMOS transistor N27 has its drain connected to the output node SN23 and the ground voltage Vss is applied to its source, When the cell plate voltage Vcp is higher than the cell plate reference voltage Vcp_ref, the controller 241 generates the pull-up control signal AA1 having a level substantially equivalent to the internal power supply voltage Vcc. When the cell plate voltage Vcp is lower than the cell plate reference voltage Vcp_ref, the controller 241 generates the pull-up control signal AA1 having a level lower than the cell plate voltage Vcp.

The controller 242 generates the pull-down control signal BB1 having a level higher than the cell plate voltage Vcp, that is a level substantially equivalent to the internal power supply voltage Vcc when the cell plate voltage Vcp is higher than the cell plate reference voltage Vcp_ref. The controller 242 generates the pull-down control signal BB1 having a level lower than the cell plate voltage Vcp that is a level substantially equivalent to the ground voltage Vss when the cell plate voltage Vcp is lower than the cell plate reference voltage Vcp_ref.

The second output voltage controller 250 includes a controller 251 that receives the internal power supply voltage Vcc, the ground voltage Vss, the pull-up control signal AA1, and the n-bias voltage Nbias in order to generate a pull-up signal PU, and a controller 252 that receives the internal power supply voltage Vcc, the ground voltage Vss, the pull-down control signal BB1, and the p-bias voltage Pbias in order to generate a pull-down signal PD.

In the controller 251, a gate of a PMOS transistor P27 receives the pull-up control signal AA1. A source and a drain of the PMOS transistor P27 are connected to the internal power supply voltage Vcc and an output node SN24, respectively. An NMOS transistor N28 is connected to NMOS transistors N22, N23, N25, and N27 in a current-mirror manner. The n-bias voltage Nbias is applied to a gate of the NMOS transistor N28. The NMOS transistor N28 has its drain connected to the output node SN24, and the ground voltage Vss is applied to its source. An inverter IV1 inverts an output signal AA of the controller 251 to output the pull-up signal PU.

The controller 252 includes a PMOS transistor P28 connected to PMOS transistors P22 and P23 in a current-mirror manner. The p-bias voltage Pbias is applied to a gate of the PMOS transistor P28. The PMOS transistor P28 has its drain connected to an output node SN25, and the internal power supply voltage is applied to its source.

A gate of an NMOS transistor N29 receives the pull-down control signal BB1 and the ground voltage Vss and the output node SN25 are connected to a source and a drain of the NMOS transistor N29, respectively. An inverter IV2 inverts an output signal BB of the controller 252 to output the pull-down signal PD.

In the controller 251, when the pull-up control signal AA1, output from the controller 241, is equal to the p-bias voltage Pbias, the same current flows through the PMOS transistors P27 and P28, and when the pull-up control signal AA1, output from the controller 241, is higher than the p-bias voltage Pbias, the current drivability of the PMOS transistor P27 is degraded and the output signal AA is at a level near the ground voltage Vss. When the pull-up control signal AA1 output from the controller 241 is lower than the p-bias voltage Pbias, the current drivability of the PMOS transistor P27 is increased and the output signal AA is at a level near the internal power supply voltage Vcc.

In brief, the output signal AA, output from the controller 251, is at the level of the internal power supply voltage Vcc when the cell plate voltage Vcp is lower than the cell plate reference voltage Vcp_ref, and is inverted through the inverter INV1 to the level of the ground voltage Vss. Then, the PMOS transistor P29, which is a pull-up element of the output driver 260, turns on at its maximum.

Operation of the cell plate voltage generator shown in FIG. 7 will now be described. First, the PMOS transistors P23 and P25 are connected in a current-mirror manner such that the same p-bias voltage Pbias is provided to the gates. Therefore, approximately the same current flows through the PMOS transistors P27 and P28. The NMOS transistors N24 and N26 are connected in a current-mirror manner such that the same n-gate voltage Ngate is applied to the gates. Therefore, approximately the same current flows through the NMOS transistors N24 and N26. That is, the relation may be described as Ids=gm(Vgs−Vt) where Ids designates the current flowing through the transistor, gm a proportional constant, Vgs a voltage difference between the gate and the source, and Vt a threshold voltage of the transistor.

According to above relation Ids=gm(Vgs−Vt), the current flowing through the NMOS transistor N24 is proportional to the value of the n-gate voltage Ngate minus the cell plate reference voltage Vcp_ref, and the current flowing through the NMOS transistor N26 is proportional to the value of the n-gate bias Ngate minus the cell plate voltage Vcp. The voltage of the pull-up control signal AA1 operates sensitively to the voltage variation of the cell plate voltage Vcp because the n-gate voltage Ngate maintains a level near the threshold voltage Vt.

For example, when the cell plate voltage Vcp is higher than the cell plate reference voltage Vcp_ref, the NMOS transistor N26 turns off and the voltage of the pull-up control signal AA1 becomes substantially equivalent to the internal power supply voltage Vcc. On the other hand, when the cell plate voltage Vcp is lower than the cell plate reference voltage Vcp_ref, the NMOS transistor N26 turns on and the voltage of the pull-up control signal AA1 becomes substantially equivalent to the cell plate voltage Vcp.

Next, the voltage of the output signal AA (from the controller 251) is determined by the drivability of the PMOS transistor P27 and the NMOS transistor N28, and the drivability of the PMOS transistor P27 is determined by the voltage of the pull-up control signal AA1. That is, when the cell plate voltage Vcp is higher than the cell plate reference voltage Vcp_ref, the NMOS transistor N26 turns off and the voltage of the pull-up control signal AA1 becomes substantially equivalent to the level of the internal power supply voltage Vcc. Next, the PMOS transistor P27 turns off and the NMOS transistor N28 turns on and the voltage of the output signal AA from the controller 251 becomes a low voltage. The voltage of the pull-up signal PU becomes substantially equivalent to the internal power supply voltage Vcc and the PMOS transistor P29 turns off.

On the other hand, when the cell plate voltage Vcp is lower than the cell plate reference voltage Vcp_ref, the NMOS transistor N26 turns on and the voltage of the pull-up control signal AA1 becomes substantially equivalent to the cell plate voltage Vcp. Next, the PMOS transistor P27 turns on and the gate voltage of the NMOS transistor N28 constantly maintains the level of the n-bias voltage Nbias. A small constant current flows through the NMOS transistor N28. Then, the NMOS transistor N28 turns on and the voltage of the output signal AA from the controller 251 becomes a high voltage. The pull-up signal PU becomes substantially equivalent to the ground voltage Vss and the PMOS transistor P29 turns on strongly.

Next, the NMOS transistors N25 and N27 are connected in a current-mirror manner such that the same n-bias voltage Nbias is provided to the gates and approximately the same current flows through the NMOS transistors N25 and N27. The PMOS transistors P24 and P26 are connected in a current-mirror manner such that the same p-bias voltage Pbias is provided to the gates and approximately the same current flows through the PMOS transistors P24 and P26. Therefore, the relation Ids=gm(Vgs−Vt) is obtained where, Ids designates the current flowing through the transistor, gm a proportional constant, Vgs a voltage difference between the gate and the source, and Vt a threshold voltage of the transistor.

In more detail, the current flowing through the PMOS transistor P24 is proportional to the value of the cell plate reference voltage Vcp_ref minus the p-gate voltage Pgate. The current flowing through the PMOS transistor P26 is proportional to the value of the cell plate voltage Vcp minus the p-gate voltage Pgate. Thus, the voltage of the pull-down control signal BB1 is maintained at a level near the threshold voltage Vt, and the PMOS transistor P26 operates sensitively to the voltage variation of the cell plate voltage Vcp.

For example, when the plate voltage Vcp is higher than the cell plate reference voltage Vcp_ref, the PMOS transistor P26 turns on and the voltage of the pull-down control signal BB1 becomes substantially equivalent to the cell plate voltage Vcp. When the cell plate voltage Vcp is lower than the cell plate reference voltage Vcp_ref, the PMOS transistor P26 turns off and the voltage of the pull-down control signal BB1 becomes substantially equivalent to the ground voltage Vss.

The voltage of the output signal BB (from the controller 252) is determined by the drivability of the PMOS transistor P28 and the NMOS transistor N29. The gate voltage of the PMOS transistor P28 constantly maintains the p-bias voltage Pbias and the small constant current flows to the NMOS transistor N29. The drivability of the NMOS transistor N27 is determined by the voltage of the pull-down control signal BB1.

That is, when the cell plate voltage Vcp is higher than the cell plate reference voltage Vcp_ref, the PMOS transistor P26 turns on and the voltage of the pull-down control signal BB1 becomes substantially equivalent to the cell plate voltage Vcp. The current then slightly flows through the PMOS transistor P28, and the PMOS transistor P28 weakly turns on and the NMOS transistor N29 strongly turns. Therefore, the voltage of the output signal BB from the controller 252 becomes a high voltage. The pull-down signal PD becomes the internal power supply voltage Vcc and the NMOS transistor N30 strongly turns on.

On the other hand, when the cell plate voltage Vcp is lower than the cell plate reference voltage Vcp_ref, the PMOS transistor P26 turns off and the voltage of the pull-down control signal BB1 becomes the ground voltage Vss. Then the current slightly flows through the PMOS transistor P28 and the PMOS transistor P28 weakly turns on and the NMOS transistor N29 turns off and the voltage of the output signal BB from the controller 252 becomes high voltage. The voltage of the pull-down signal PD becomes substantially equivalent to the ground voltage Vss and the NMOS transistor N30 turns off.

Figure 9:
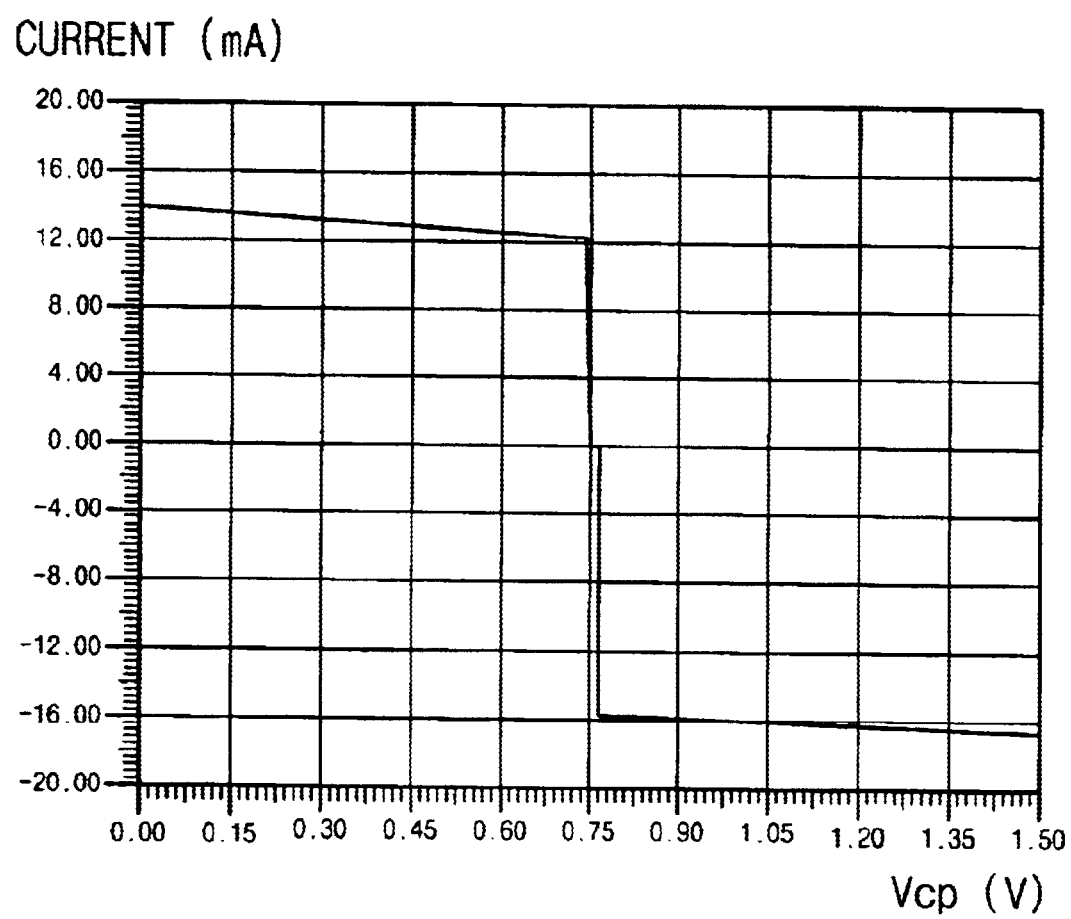
FIG. 9 is a graph illustrating a current waveform of a cell plate voltage in FIG. 7.

FIGS. 8A through 8G are graphs illustrating resultant values of the voltages Vcp, PU, PD, AA1, AA, BB1, BB in FIG. 7. FIG. 9 is a graph illustrating a current waveform of the cell plate voltage Vcp in FIG. 7. Referring to FIG. 9, the pull-up and the pull-down elements can sufficiently turn on, and current drivability of over ±12 mA can be assured at the voltage difference of 0.05V, thereby providing the stable cell plate voltage Vcp to the output stage.

Figure 10:
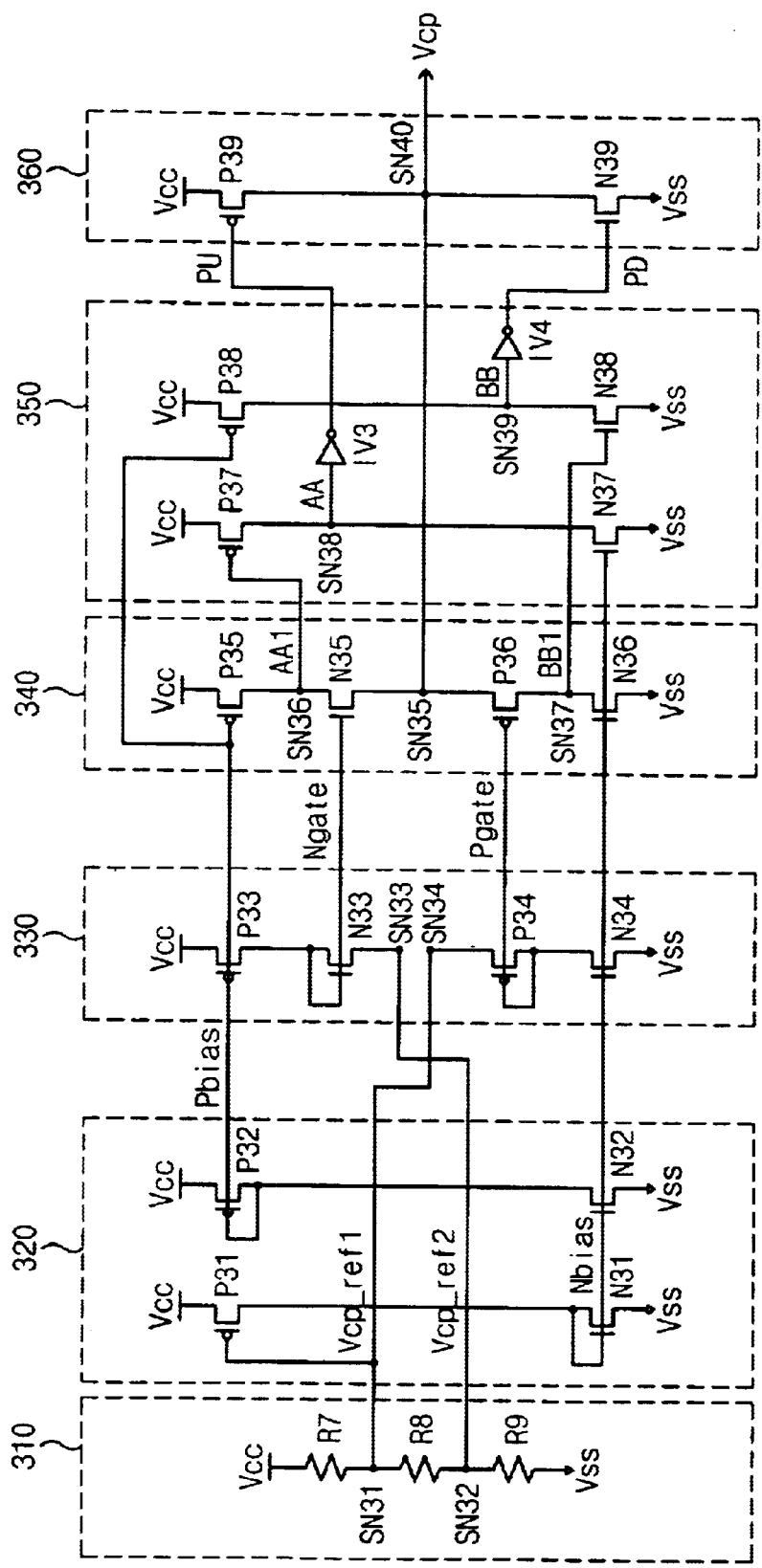
FIG. 10 is a circuit diagram of still another disclosed cell plate voltage generator.
Figure 11A:
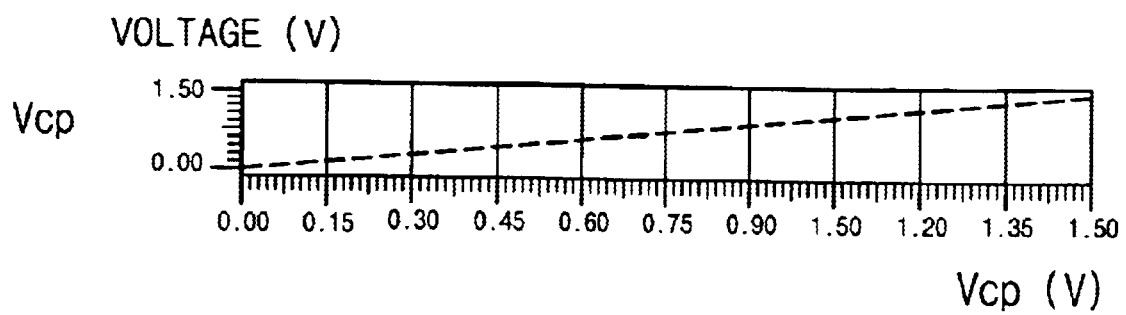
FIGS. 11A through 11E are graphs illustrating voltages (Vcp, PU, PD, Vcp, ref1 and Vcp ref2 respectively in FIGS. 11A–11E) of the embodiment shown in FIG. 10.
Figure 11B:
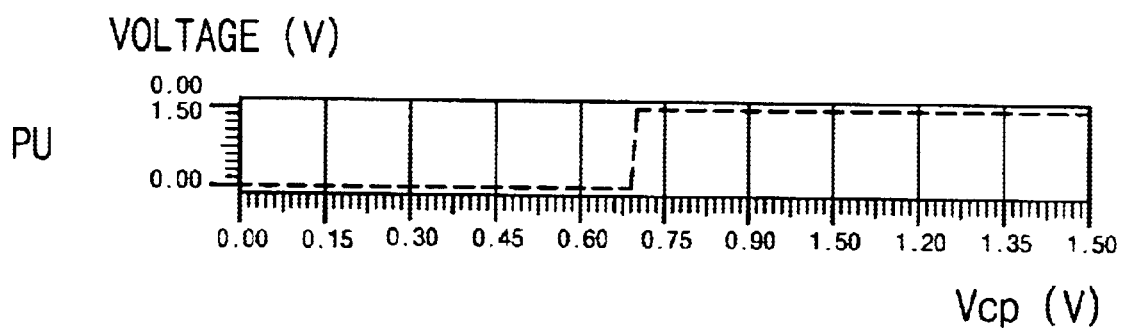
Figure 11C:
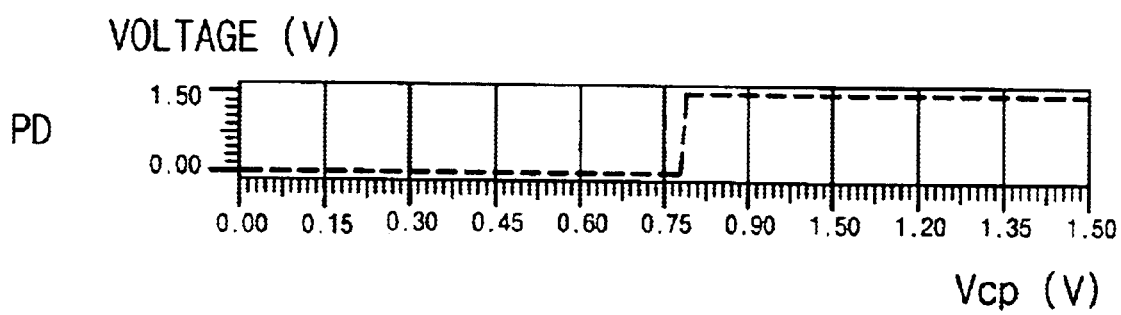
Figure 11D:
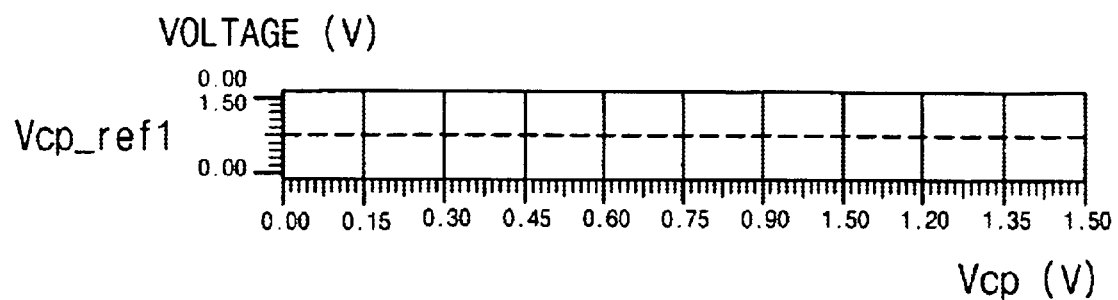
Figure 11E:
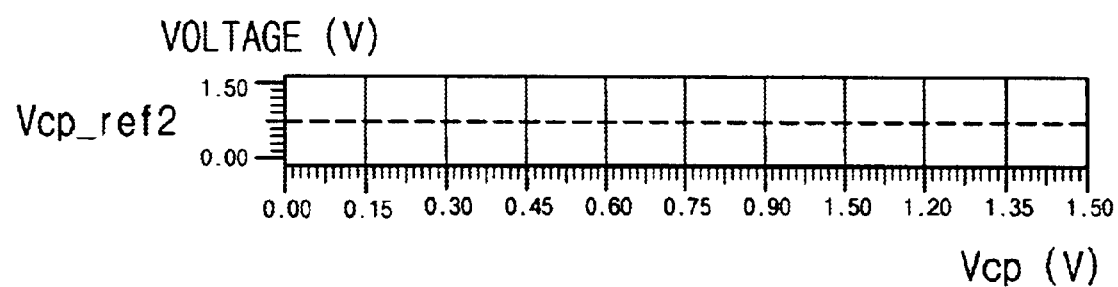

FIG. 10 is a circuit diagram of still another cell plate voltage generator constructed in accordance with the teachings of the invention, and includes a voltage divider 310, a bias voltage generator 320, a gate voltage generator 330, a first output voltage controller 340, a second output voltage controller 350 and an output driver 360.

The construction and operation of the first output voltage controller 340, the second output voltage controller 350 and the output driver 360 are substantially identical to the first output voltage controller 240, the second output voltage controller 250 and the output driver 260 of the cell plate voltage generator described in connection with FIG. 7. Accordingly, the detailed description of the first output voltage controller 340, the second output voltage controller 350 and the output driver 360, will be omitted.

The voltage divider 310 includes resistors R7, R8 and R9 connected in series between the internal power supply voltage Vcc and the ground voltage Vss. The voltage divider 310 generates a first cell plate reference voltage Vcp_ref1 and a second cell plate reference voltage Vcp_ref2. The first cell plate reference voltage Vcp_ref1 is used to drive the pull-down element N39 while the second cell plate reference voltage Vcp_ref2 is used to drive the pull-up device P39.

The bias voltage generator 320 includes a PMOS transistor P31 and a NMOS transistor N31 connected in series between the internal power supply voltage and the ground voltage Vss. The cell plate reference voltage Vcp_ref is applied to a gate of the PMOS transistor P31, and the internal power supply voltage Vcc is applied to its source. The NMOS transistor N31 has its gate connected to its drain and the ground voltage Vss is applied to its source. Its drain is connected to a drain of the PMOS transistor P31.

The bias voltage generator 320 further includes a PMOS transistor P32 and a NMOS transistor N32 connected in series between the internal power supply voltage Vcc and the ground voltage Vss. The PMOS transistor P32 has its gate connected to its drain and the internal power supply voltage Vcc is applied to its source. The NMOS transistor N32 is connected to the NMOS transistor N31 in a current-mirror manner. An n-bias voltage Nbias is applied to a gate of the NMOS transistor N32. The NMOS transistor N32 has its drain connected to the drain of the PMOS transistor P32 and the ground voltage Vss is applied to its source.

The bias voltage generator 320 generates the n-bias voltage Nbias for flowing a constant current to the ground voltage Vss from the internal power supply voltage Vcc. Similarly, the bias voltage generator 320 generates the p-bias voltage Pbias for flowing a constant current from the internal power supply voltage Vcc.

The gate voltage generator 330 includes a PMOS transistor P33, an NMOS transistor N33, a PMOS transistor P34, and an NMOS transistor N34 sequentially connected in series between the internal power supply voltage Vcc and the ground voltage Vss. The PMOS transistor P33 is connected to the PMOS transistor P32 in a current-mirror manner. The p-bias voltage Pbias is applied to a gate of the PMOS transistor P33. The internal power supply voltage Vcc is applied to a source of the PMOS transistor P33. A gate and a source of the NMOS transistor N33 are connected to each other. The drain and a source of the NMOS transistor N33 are connected to a drain of the PMOS transistor P33 and a node SN33, respectively. A gate and a drain of the PMOS transistor P34 are connected to each other. A source of the PMOS transistor P34 is connected to the node SN34. The NMOS transistor N34 is connected to the NMOS transistors N31 and N32 in a current-mirror manner. The n-bias voltage Nbias is applied to a gate of the NMOS transistor N34 and the ground voltage Vss is applied to its source. The NMOS transistor N34 has its drain is connected to the drain of the PMOS transistor P34.

Operation of the cell plate voltage generator shown in FIG. 10 will now be described. In the cell plate voltage generator in FIG. 10, the NMOS transistor N39, which is the pull-down element, and the PMOS transistor P39, which is the pull-up element, do not operate in the range that the cell plate voltage generator does not operate, thereby preventing the excessive current consumption.

Accordingly, the voltage range of the cell plate voltage Vcp is divided into a first range, a second range and a third range. The first range covers the internal power supply voltage Vcc to first cell plate reference voltage Vcp_ref1, the first range where the cell plate voltage Vcp is higher than the first cell plate reference voltage Vcp_ref1. The second range covers the first cell plate reference voltage Vcp_ref1 to the second cell plate reference voltage Vcp_ref2, the second range where the cell plate voltage Vcp is between the first cell plate reference voltage Vcp_ref1 and the second cell plate reference voltage Vcp_ref2. The third range is where the cell plate voltage Vcp is less than the second cell plate reference voltage Vcp_ref2.

In the first range, the PMOS transistor P39, which is the pull-up element, turns off and the NMOS transistor N39, which is the pull-down element, turns on. In the second range, the PMOS transistor P39, which is the pull-up element, turns off and the NMOS transistor N39, which is pull-down element, turns off. In the third range, the PMOS transistor P39, which is the pull-up element, turns on and the NMOS transistor N39, which is the pull-down element, turns off.

In other words, when the cell plate voltage Vcp is higher than the second cell plate reference voltage Vcp_ref2, the PMOS transistor P39 turns off, and when the cell plate voltage Vcp is lower than the second cell plate reference voltage Vcp_ref2, the PMOS transistor P39 turns on. On the other hand, when the cell plate voltage Vcp is higher than the first cell plate reference voltage Vcp_ref1, the NMOS transistor turns on, and when the cell plate voltage Vcp is lower than the first cell plate reference voltage Vcp_ref1, the NMOS transistor N39 turns off.

Therefore, in the range where the cell plate voltage generator does not operate, the pull-up element, PMOS transistor P39, and the pull-down element, NMOS transistor N39, turn off, thereby preventing excessive current consumption.

Figure 12:
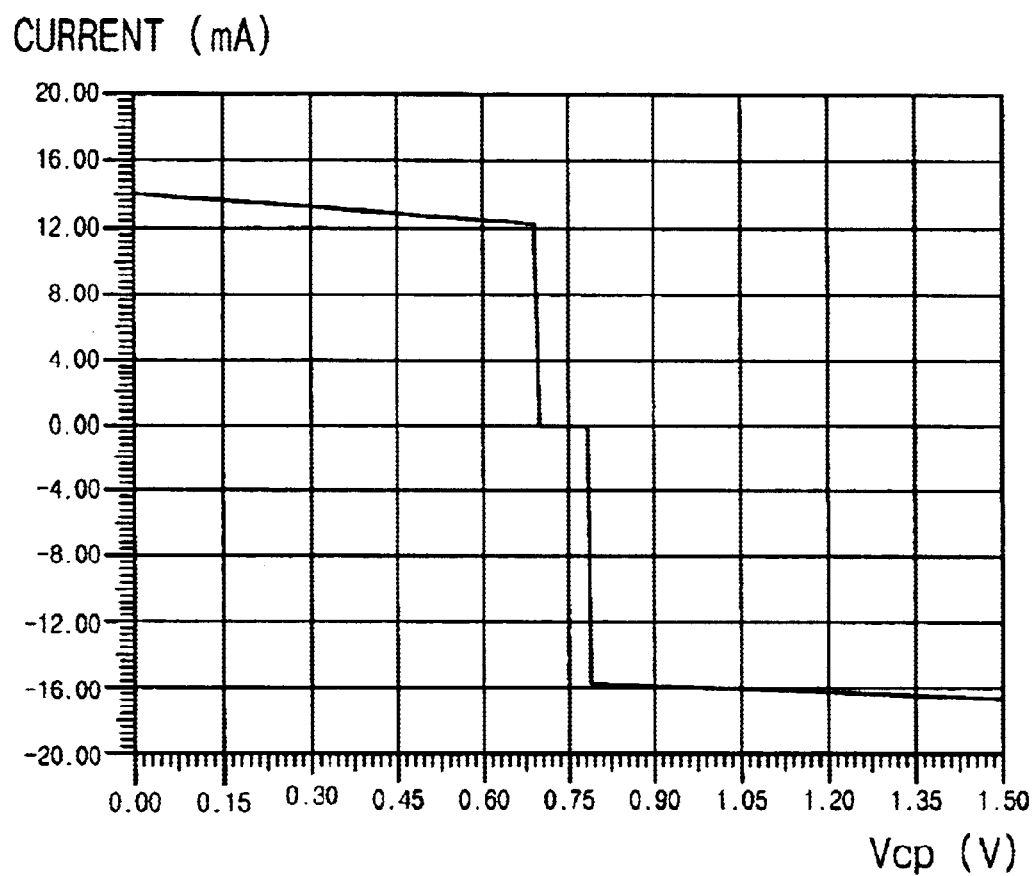
FIG. 12 is a graph illustrating a current waveform of a cell plate voltage for the embodiment shown in FIG. 10.

FIGS. 11A through 11E are graphs illustrating resultant values of the voltages Vcp, PD, ref1 and Vcp ref2 respectively for the embodiment shown in FIG. 10. FIG. 12 is a graph illustrating a current waveform of the cell plate voltage Vcp for the embodiment shown in FIG. 10 or a current waveform of a bit line precharge voltage Vblp. Referring to FIG. 12, it is obvious that the pull-up and the pull-down elements can sufficiently turn on and that the current drivability of over ±12 mA at the voltage difference of 0.05V can be assured, thereby reducing the current consumption in range of the cell plate voltage generator does not operate.

Accordingly, the cell plate voltage generator controls the gate signal of the output driver to cause it to swing between the internal power supply voltage and the ground voltage, thereby improving the current drivability and the stable cell plate voltage or the bit line precharge voltage. Furthermore, although the internal power supply voltage is lower, it is possible to assure stable operation to minimize the voltage variation in a generator for a cell plate voltage Vcp and a generator for ½ Vcc voltage such as a bit line precharge voltage Vblp so that it is applicable to a low noise circuit.

From the foregoing, persons of ordinary skill in the art will appreciate that numerous cell plate voltage generators have been disclosed. Although certain cell plate voltage generators constructed in accordance with the teachings of this disclosure have been described herein, the scope and coverage of this patent is not limited thereto. On the contrary, this patent covers all embodiments that fairly fall within the scope of the appended claims either literally or under the doctrine of equivalents.

From the foregoing, persons of ordinary skill in the art will appreciate that numerous cell plate voltage generators have been disclosed. Although certain cell plate voltage generators constructed in accordance with the teachings of the invention have been described herein, the scope and coverage of this patent is not limited thereto. On the contrary, this patent covers all embodiments of the teachings of the invention fairly falling within the scope of the appended claims either literally or under the doctrine of equivalents.

What is claimed is:

1. A voltage generator for semiconductor memory device, comprising:

an output voltage controller to generate a pull-up signal for a pull-up operation and a pull-down signal for controlling a pull-down operation, the pull-up signal having a level substantially equivalent to an internal power supply voltage if a cell plate voltage is higher than a cell plate reference voltage, and a level below the cell plate voltage if the cell plate voltage is lower than the cell plate reference voltage; and an output driver to generate a stable cell plate voltage in response to the pull-up signal and the pull-down signal;

wherein the output voltage controller comprises:

a voltage divider to divide the internal power supply voltage and generate the cell plate reference voltage;

a bias voltage generator to receive the cell plate reference voltage and to generate a p-bias voltage and an n-bias voltage;

a gate voltage generator to receive the cell plate reference voltage, the p-bias voltage and the n-bias voltage, and to generate a p-gate voltage and an n-gate voltage;

a pull-up controller to receive the cell plate reference voltage, the p-bias voltage, the n-bias voltage and the cell plate voltage, and to generate the pull-up signal: and a pull-down controller to receive the n-bias voltage, the n-bias voltage, the p-gate voltage, the n-gate voltage and the cell plate voltage, and to generate the pull-down signal.

2. The voltage generator as claimed in claim 1, wherein the bias voltage generator generates the p-bias voltage to cause a constant current flow from the internal power supply voltage and generates the n-bias voltage to cause a constant current flow to the ground voltage.

3. The voltage generator as claimed in claim 1, wherein the gate voltage generator generates the n-gate voltage at a voltage higher than the cell plate reference voltage by a threshold voltage of an NMOS transistor and generates the p-gate voltage at a voltage lower than the cell plate reference voltage by a threshold voltage of a PMOS transistor.

4. The voltage generator as claimed in claim 1, wherein the pull-up controller comprises:

a first transistor having a gate, a source, and a drain, wherein the source is connected to the internal power supply voltage and the drain is connected to an output node, and wherein the p-bias voltage is applied to the gate;

a second transistor and a third transistor connected in series between the output node and the ground voltage, wherein the cell plate reference voltage and the n-bias voltage are applied to a gate of the second transistor and a gate of the third transistor; and fourth, fifth and sixth transistors connected in series between the internal power supply voltage and the ground voltage, wherein the p-bias voltage, the cell plate voltage and the n-bias voltage are respectively applied to the gate of the fourth, fifth and sixth transistors, wherein the sources of the second and fifth transistors are connected to each other.

5. The voltage generator as claimed in claim 1, wherein the output driver receives the pull-up signal, and wherein the pull-up signal has a level substantially equivalent to the internal power supply voltage when the cell plate voltage is higher than the cell plate reference voltage, and wherein the pull-up signal has a level below the cell plate voltage when the cell plate voltage is lower than the cell plate reference voltage.

6. The voltage generator as claimed in claim 1, wherein the output driver comprises:

a pull-up element to receive the pull-up signal, wherein the pull-up element is connected between the internal power supply voltage and an output stage; and a pull-down element to receive the pull-down signal, wherein the pull-down element is connected between the output stage and the ground voltage.

7. A voltage generator for a semiconductor memory device, comprising:

an output voltage controller to generate a pull-up control signal and a pull-down control signal, wherein the pull-up control signal has a level substantially equivalent to an internal power supply voltage if a cell plate voltage is higher than a cell plate reference voltage, and a level below the cell plate voltage if the cell plate voltage is lower than the cell plate reference voltage, and wherein the pull-down control signal has a level above the cell plate voltage if the cell plate voltage is higher than the cell plate reference voltage and a level of a ground voltage if the cell plate voltage is lower than the cell plate reference voltage; and an output driver to generate a stable cell plate voltage in response to the pull-up control signal and the pull-down control signal;

wherein the output voltage controller comprises:

a voltage divider to divide the internal power supply voltage to generate the cell plate reference voltage;

a bias voltage generator to receive the cell plate reference voltage and to generate a a-bias voltage and a n-bias voltage;

a gate voltage generator to receive the cell plate reference voltage, the p-bias voltage and the n-bias voltage, and to generate a p-gate voltage and a n-gate voltage;

a first output voltage controller to receive the p-bias voltage, the n-bias voltage, the p-gate voltage, the n-gate voltage and the cell plate voltage, and to generate the pull-down control signal and the pull-up control signal; and a second output voltage controller to receive the p-bias voltage, the n-bias voltage, the pull-up control signal and the pull-down control signal, and to generate the pull-up signal and the pull-down signal.

8. The voltage generator as claimed in claim 7, wherein the voltage divider divides the internal power supply voltage to generate a first cell plate reference voltage and a second cell plate reference voltage, and wherein the first cell plate reference voltage is used for a pull-up operation of the output driver and the second cell plate reference voltage is used for a pull-down operation of the output driver.

9. The voltage generator as claimed in claim 8, wherein the bias voltage generator comprises:

a first transistor having a gate, a source, and a drain, wherein the first cell plate reference voltage is applied to the gate of the first transistor and the internal power supply voltage is applied to the source of the first transistor;

a second transistor having a gate, a source and a drain, wherein the source of the second transistor is connected to the drain of the first transistor and the drain of the second transistor is connected to the ground voltage, and wherein the second transistor has a current-mirror structure; and a third transistor and a fourth transistor connected in series between the internal power supply voltage and the ground voltage, wherein the third and fourth transistor have a current-mirror structure.

10. The voltage generator as claimed in claim 8, wherein the gate voltage generator comprises:

a first transistor and a second transistor having a current-mirror structure, wherein the first and second transistors generate the n-gate voltage from the internal power supply voltage, the first cell plate reference voltage and the p-bias voltage; and a third transistor and a fourth transistor having a current-mirror structure, wherein the third and fourth transistors generate the p-gate voltage from the second cell plate reference voltage, the ground voltage and the n-bias voltage.

11. The voltage generator as claimed in claim 8, wherein the output driver comprises:

a pull-up element that turns off when the cell plate voltage is higher than the second cell plate reference voltage and turns on when the cell plate voltage is lower than the second cell plate reference voltage; and a pull-down element that turns on when the cell plate voltage is higher than the first cell plate reference voltage and turns off when the cell plate voltage is lower than the first cell plate reference voltage.

12. The voltage generator as claimed in claim 7, wherein the bias voltage generator generates the p-bias voltage to cause a constant current flow from the internal power supply voltage and generates the n-bias voltage to cause a constant current flow to the ground voltage.

13. The voltage generator as claimed in claim 7, wherein the gate voltage generator generates the n-gate voltage and the p-gate voltage, and wherein the n-gate voltage is higher than the cell plate reference voltage by a threshold voltage of a MOS transistor, and wherein the p-gate voltage that is lower than the cell plate reference voltage by a threshold voltage of a PMOS transistor.

14. The voltage generator as claimed in claim 7, wherein the first output voltage controller comprises:

a first controller to generate the pull-up control signal, wherein the pull-up control signal has a level substantially equivalent to the internal power supply voltage if the cell plate voltage is higher than the cell plate reference voltage and has a level below the cell plate voltage if the cell plate voltage is lower than the cell plate reference voltage; and a second controller to generate the pull-down control signal, wherein the pull-down control signal has a level above the cell plate voltage if the cell plate voltage is higher than the cell plate reference voltage and has a level of a ground voltage if the cell plate voltage is lower than the cell plate reference voltage.

15. The voltage generator as claimed in claim 14, wherein the first controller comprises:

a first PMOS transistor and a first NMOS transistor to generate the pull-up control signal from the internal power supply voltage, the p-bias voltage, the n-gate voltage and the cell plate voltage; and a second PMOS transistor and a second NMOS transistor to generate the pull-down control signal from the p-gate voltage, the n-bias voltage, the cell plate voltage and the ground voltage.

16. The voltage generator as claimed in claim 7, wherein the second output voltage controller includes:

a first controller to generate the pull-up signal, wherein the pull-up signal has a level substantially equivalent to the internal power supply voltage if the cell plate voltage is higher than the cell plate reference voltage and has a level substantially equivalent to the ground voltage if the cell plate voltage is lower than the cell plate reference voltage; and a second controller to generate the pull-down signal, wherein the pull-down signal has a level substantially equivalent to the internal power supply voltage if the cell plate voltage is higher than a cell plate reference voltage and has a level substantially equivalent to the ground voltage if the cell plate voltage is lower than the cell plate reference voltage.

17. The voltage generator as claimed in claim 16, wherein the first controller comprises:

a first PMOS transistor and a first NMOS transistor to generate the pull-up signal from the pull-up control signal, the n-bias voltage, the internal power supply voltage and the ground voltage; and wherein the second controller comprises:

a second PMOS transistor and a second NMOS transistor to generate the pull-down signal from the p-bias voltage, the pull-down control signal, the internal power supply voltage and the ground voltage.

18. The voltage generator as claimed in claim 7, wherein the output driver comprises:

a pull-up element that turns on when the pull-up signal has a level substantially equivalent to the ground voltage when the cell plate voltage is lower than the cell plate reference voltage; and a pull-down element that turns on when the pull-down signal has a level substantially equivalent to the internal power supply voltage when the cell plate voltage is higher than the cell plate reference voltage.

* * * * *

UNITED STATES PATENT AND TRADEMARK OFFICE
CERTIFICATE OF CORRECTION

PATENT NO. : 6,721,211 B2  Page 1 of 1
APPLICATION NO. : 10/246083
DATED : April 13, 2004
INVENTOR(S) : Jae Jin Lee et al.

It is certified that error appears in the above-identified patent and that said Letters Patent is hereby corrected as shown below:

In the Claims:

Claim 1,
Column 13, Line 8    Please delete "for semiconductor" and replace with --for a semiconductor--.

Claim 1,
Column 13, Line 34   Please delete "n-bias" and replace with --p-bias--.

Signed and Sealed this

Fifth Day of June, 2007

JON W. DUDAS
*Director of the United States Patent and Trademark Office*